(12) United States Patent
Liu

(10) Patent No.: US 11,968,762 B2
(45) Date of Patent: Apr. 23, 2024

(54) WALL SWITCH PANEL AND LIGHT FITTING

(71) Applicants: SUZHOU OPPLE LIGHTING CO., LTD., Suzhou (CN); OPPLE LIGHTING CO., LTD., Shanghai (CN)

(72) Inventor: Gang Liu, Suzhou (CN)

(73) Assignees: SUZHOU OPPLE LIGHTING CO., LTD., Suzhou (CN); OPPLE LIGHTING CO., LTD., Shanghai (CN)

( * ) Notice: Subject to any disclaimer, the term of this patent is extended or adjusted under 35 U.S.C. 154(b) by 274 days.

(21) Appl. No.: 17/561,650

(22) Filed: Dec. 23, 2021

(65) Prior Publication Data

US 2022/0124899 A1 Apr. 21, 2022

Related U.S. Application Data

(63) Continuation of application No. PCT/CN2020/138654, filed on Dec. 23, 2020.

(30) Foreign Application Priority Data

Dec. 30, 2019 (CN) .......................... 201911391998.1
Dec. 30, 2019 (CN) .......................... 201922453682.2

(51) Int. Cl.
*H05B 47/10* (2020.01)
*H03K 17/96* (2006.01)
(Continued)

(52) U.S. Cl.
CPC ............. *H05B 47/19* (2020.01); *H03K 17/96* (2013.01); *H01H 9/0271* (2013.01)

(58) Field of Classification Search
CPC .... H05B 41/048; H05B 47/10; H05B 47/105; H05B 47/14; H05B 47/175; H05B 47/19; H05B 47/195; H03K 17/96; H01H 9/0271
See application file for complete search history.

(56) References Cited

U.S. PATENT DOCUMENTS

2019/0174611 A1 6/2019 Senas
2021/0138230 A1* 5/2021 Yoshida ............... A61N 1/0408

FOREIGN PATENT DOCUMENTS

| CN | 102665337 A | 9/2012 |
| CN | 110209098 A | 9/2019 |
| CN | 110232811 A | 9/2019 |

OTHER PUBLICATIONS

International Search Report of PCT Application No. PCT/CN2020/138654 dated Feb. 25, 2021 with English translation, (4p).

* cited by examiner

*Primary Examiner* — Long Nguyen
(74) *Attorney, Agent, or Firm* — Arch & Lake LLP

(57) ABSTRACT

The present disclosure discloses a wall switch panel and a light fitting. The wall switch panel includes a touch panel, a micro-control module, and a wireless module. The touch panel has a first communication interface; the micro-control module has a second communication interface and a third communication interface, and the micro-control module is electrically connected with the first communication interface through the second communication interface; the wireless module has a fourth communication interface and is electrically connected with the third communication interface through the fourth communication interface.

19 Claims, 1 Drawing Sheet

(51) Int. Cl.
*H05B 47/19* (2020.01)
*H01H 9/02* (2006.01)

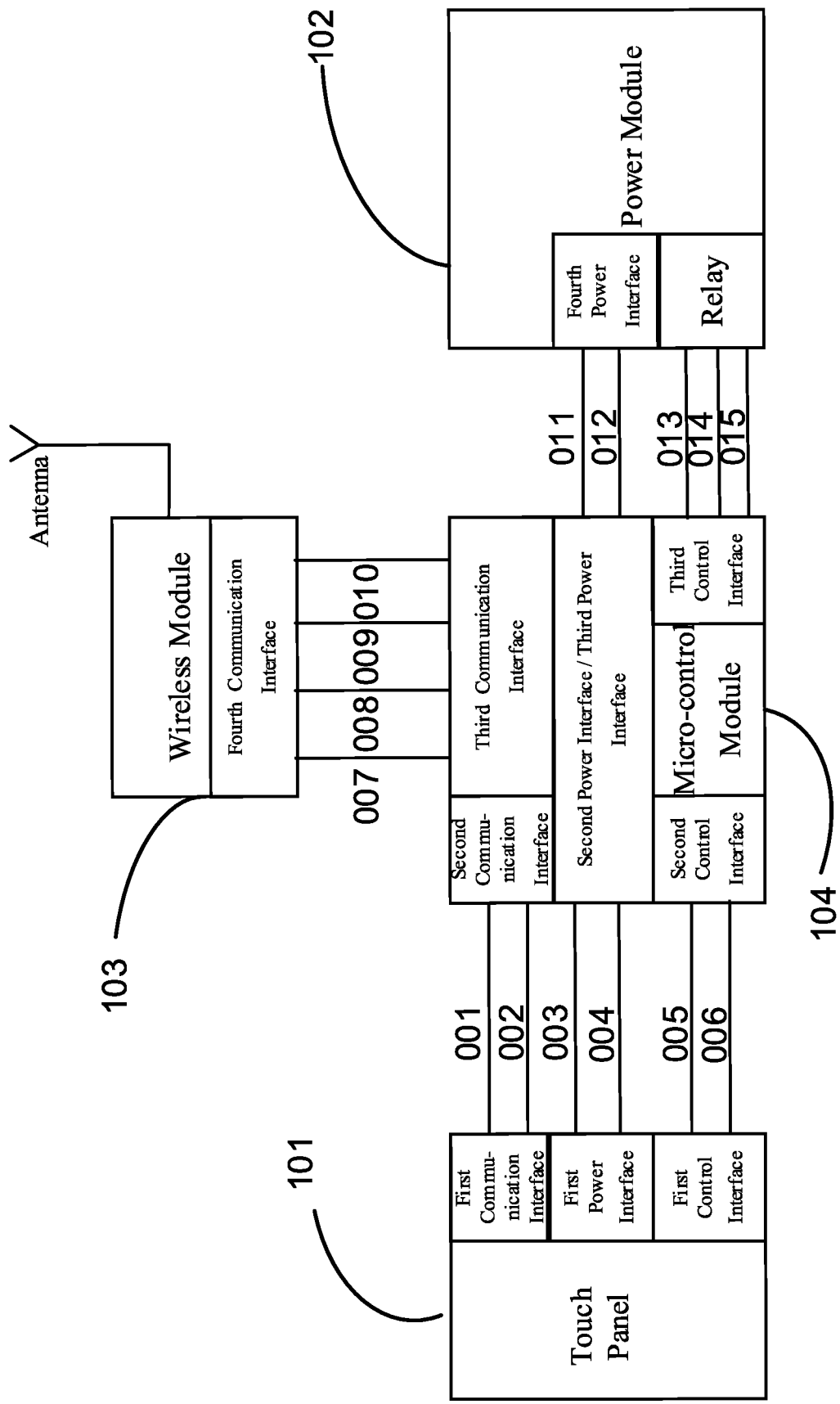

WALL SWITCH PANEL AND LIGHT FITTING

CROSS-REFERENCE TO RELATED APPLICATIONS

This application is based upon and claims the priority of PCT patent application No. PCT/CN2020/138654 filed on Dec. 23, 2020 which claims priority to the Chinese patent application No. 201911391998.1 filed on Dec. 30, 2019, and the Chinese patent application No. 201922453682.2 filed on Dec. 30, 2019, the entire contents of which are hereby incorporated by reference herein for all purposes.

TECHNICAL FIELD

The present disclosure relates to a technical filed of wall switch panels, and particularly relates to a wall switch panel and a light fitting.

BACKGROUND

With the improvement of living standards, people have higher and higher requirements for quality of life. As a wall switch, the rocker type mechanical switch is replaced by an electronic switch. Illustratively, the electronic switch can be a voice-controlled time-delay switch, a touch time-delay switch, a human body induction switch, etc. However, the electronic switch only has the function of controlling the on or off of electrical appliances, and the function thereof is relatively simple.

SUMMARY

The present disclosure discloses a wall switch panel and a light fitting.

In the first aspect, the present disclosure provides a wall switch panel. The wall switch panel may include:

A touch panel, having a first communication interface; a micro-control module, having a second communication interface and a third communication interface, and the micro-control module being electrically connected with the first communication interface through the second communication interface; and a wireless module, having a fourth communication interface and being electrically connected with the third communication interface through the fourth communication interface.

The touch panel may be configured to transmit obtained touch information of a user to the micro-control module via the first communication interface and the second communication interface; the micro-control module may be configured to generate a parameter adjustment instruction according to the touch information, and to transmit the parameter adjustment instruction to the wireless module via the third communication interface and the fourth communication interface; and the wireless module may be configured to send, via an antenna, the parameter adjustment instruction to an electrical appliance to be controlled, so as to drive the electrical appliance to be controlled to perform a corresponding adjustment operation.

In the second aspect, the present disclosure provides a light fitting. The light fitting may include the wall switch panel as mentioned above, a wireless receiving module, a controller and a light body.

The wireless receiving module may be electrically connected with the controller, and the wireless receiving module may be configured to receive the parameter adjustment instruction sent by the wireless module of the wall switch panel and to send the parameter adjustment instruction to the controller.

The controller may be electrically connected with the light body, and the controller adjusts the light body according to the parameter adjustment instruction, correspondingly.

It is to be understood that both the foregoing general description and the following detailed description are exemplary and explanatory only and are not restrictive of the present disclosure.

BRIEF DESCRIPTION OF THE DRAWINGS

The accompanying drawings described herein are intended to provide a further understanding of the present disclosure, and constitute a part of the disclosure, examples of the disclosure and together with the description serve to explain the disclosure, and constitute no undue limitation to the present disclosure. In the accompanying drawings:

FIG. 1 is a schematic structural diagram of a wall switch panel provided by an example of the present disclosure.

DETAILED DESCRIPTION

In order to make objects, technical details and advantages of the present disclosure apparent, the technical solutions of the present disclosure will be described in a clearly and fully understandable way in connection with the examples and the corresponding drawings of the present disclosure. Apparently, the described examples are just a part but not all of the examples of the disclosure. Based on the examples in the present disclosure, those skilled in the art can obtain other example(s), without any inventive work, which should be within the protection scope of the present disclosure.

As shown in FIG. 1, the wall switch panel provided by the example of the present disclosure includes a touch panel 101, a micro-control module 104 and a wireless module 103. The connection and operation relationship among the touch panel 101, the micro-control module 104 and the wireless module 103 are described below, the details are as follows:

The touch panel 101 is configured to obtain touch information of a user, and the touch panel 101 has a first communication interface. The touch information can include touch position information and/or the count of touch points.

Illustratively, the touch information is the number of touch points, which can be 11. That is, the touch panel 101 described in the example of the present disclosure supports 11-point simultaneous touch.

In some implementations, the operation current of the touch panel in the low power consumption operating mode ranges from 8 mA to 12 mA; the operation current of the touch panel in the standby mode is 3 mA, and the operation current of the touch panel in the sleep mode is less than 20 µA.

In some implementations, the accuracy of the touch panel 101 is ±1 mm at the center and ±1.5 mm at the peripheral edges.

It should be added here that the touch panel 101 provided by the example of the present disclosure can operate normally under the condition of water mist.

The micro-control module 104 has a second communication interface and a third communication interface, and is electrically connected with the first communication interface through the second communication interface. The micro-control module 104 is configured to receive the touch information via the first communication interface and the second communication interface, and to generate a parameter adjustment instruction according to the touch information.

Illustratively, the touch information is touch position information, and the micro-control module stores the corresponding relationship between the touch position information and parameter adjustment instructions. The micro-control module generates a parameter adjustment instruction based on the touch position information and the corresponding relationship between the touch position information and the parameter adjustment instructions.

For example, the touch position information is coordinate point A ($X_1$, $Y_1$), the coordinate point A corresponds to the 50% brightness adjustment instruction of the light fitting, and the micro-control module generates the 50% brightness adjustment instruction of the light fitting based on the coordinate point A and the corresponding relationship between the coordinate point A and the 50% brightness adjustment instruction of the light fitting.

For example, the touch position information is coordinate point B ($X_2$, $Y_2$), the coordinate point B corresponds to the chromaticity adjustment instruction of cool color of the light fitting, and the micro-control module generates the chromaticity adjustment instruction of cool color of the light fitting based on the coordinate point B and the corresponding relationship between the coordinate point B and the chromaticity adjustment instruction of cool color of the light fitting.

Illustratively, the touch information is the number of touch points, and the micro-control module stores the corresponding relationship between the number of touch points and the parameter adjustment instruction. The micro-control module generates a parameter adjustment instruction based on the number of touch points and the corresponding relationship between the number of touch points and the parameter adjustment instructions.

For example, the number of touch points is 11, and 11 touch points correspond to the chromaticity adjustment instruction of warm color of the light fitting. The micro-control module generates the chromaticity adjustment instruction of warm color of the light fitting based on the 11 touch points and the corresponding relationship between the 11 touch points and the chromaticity adjustment instruction of warm color of the light fitting.

For example, the number of touch points is 3, 3 touch points correspond to the 70% brightness adjustment instruction of the light fitting, and the micro-control module generates the 70% brightness adjustment instruction of the light fitting based on the 3 touch points and the corresponding relationship between the 3 touch points and the 70% brightness adjustment instruction of the light fitting.

The wireless module 103 has a fourth communication interface and is electrically connected with the third communication interface through the fourth communication interface. The wireless module 103 is configured to send, via an antenna, the parameter adjustment instruction to an electrical appliance to be controlled, so as to drive the electrical appliance to perform a corresponding adjustment operation.

Illustratively, the electric appliance to be controlled can be a light fitting, and the light fitting has a wireless receiving module used for receiving the parameter adjustment instruction.

The wireless module 103 can include a WIFI module and/or an RF (Radio Frequency) module.

In some implementations, as shown in FIG. 1, 001 is SDA, 002 is SCL, 003 is +3.3V, 004 is GND, 005 is INT, 006 is RST, 007/008/009/010 are SPI communication bus interfaces, 011 is +5V, 012 is GND, 013/014/015 are control interfaces of three-way control delay.

The touch panel TP101 obtains touch position information of a user's touch operation; and the micro-control module MCU104 judges the parameter adjustment instruction according to the position information. When the user touches TP, the first communication interface of the touch panel TP101 is mainly an I2C interface, which communicates via the I2C bus, and the micro-control module 104 reads the I2C bus signal via the second communication interface to obtain the position information. The micro-control module 104 converts the obtained position information into a parameter adjustment instruction, and then transmits the parameter adjustment instruction to the wireless module 103 via the third communication interface; and the wireless module 103 transmits the parameter adjustment instruction to the light fitting via the antenna, so as to drive the light fitting to perform a corresponding adjustment operation, thus realizing the adjustment of the light intensity, color temperature and other modes of the light fitting.

In practical application, the wall switch panel provided by the example of the present disclosure can include a circle of surrounding walls, a middle frame and an adhesive layer; the surrounding walls are arranged in the middle frame, and besides, the middle frame can further include a bottom plate; the surrounding walls are arranged around the bottom plate; and the touch panel is adhered to the bottom plate through the adhesive layer. Of course, the wall switch panel can further include other structures, without being specifically limited in the example of the present disclosure.

As shown in FIG. 1, the wall switch panel provided by the example of the present disclosure can further include a power module 102. The micro-control module 104 described in the above example further has a third control interface.

The power module 102 can include a relay and be electrically connected with the third control interface through the relay.

The micro-control module 104 is further configured to generate a switch control instruction according to the touch information, and transmit the switch control instruction to the relay via the third control interface, so as to drive the relay to perform a corresponding switch operation.

The relay in the example of the present disclosure can include an AC/DC conversion module, and in some implementations, the relay converts 220V voltage into 5V voltage.

Illustratively, the maximum switching voltage of the relay is 277 VAC/30 VDC, the maximum switching current of the relay is 10 A, and the maximum switching power of the relay is 2500 WAC/300 WDC.

In some implementations, as shown in FIG. 1, 001 is SDA, 002 is SCL, 003 is +3.3V, 004 is GND, 005 is INT, 006 is RST, 007/008/009/010 are SPI communication bus interfaces, 011 is +5V 012 is GND, 013/014/015 are control interfaces of three-way control delay.

The touch panel TP101 obtains touch position information of a user's touch operation; the micro-control module MCU104 judges the switch control instruction according to the position information, and the specific judgment manner is detailed in the relevant description of the above example, and will not be repeated here. The power module 102 outputs power for a wall switch portion. When the user touches TP, the first communication interface of the touch panel TP101 is mainly an I2C interface, which communicates via the I2C bus, and the micro-control module 104 reads the I2C bus signal via the second communication interface to obtain the position information. The micro-control module 104 outputs, via the third control interface, a control signal to control the on or off of a triode, so as to control the on or off of the switch of the relay. The micro-control module 104 converts the obtained position information into a switch control instruction, and then transmits the switch control instruction to the relay via the third communication interface, so as to control the on or off of the switch of the relay, thus turning on or off the live wire power supply of the light fitting.

As shown in FIG. 1, the touch panel described in the above example further has a first power interface. The micro-control module 104 described in the above example further has a second power interface and a third power interface, and is electrically connected with the first power interface through the second power interface. The power module 102 described in the above example can include a fourth power interface and be electrically connected with the third power interface through the fourth power interface. Among them, the power module 102 is configured to supply power to the micro-control module 104 through the fourth power interface and the third power interface, and to supply power to the touch panel through the fourth power interface, the third power interface, the second power interface and the first power interface.

In some implementations, as shown in FIG. 1, the power module 102 supplies +5V voltage to the micro-control module 104, and the power module 102 supplies +3.3V voltage to the touch panel.

As shown in FIG. 1, the touch panel described in the above example further has a first control interface. The micro-control module 104 described in the above example further has a second control interface and is electrically connected with the first control interface through the second control interface. The micro-control module 104 is configured to control the touch panel to perform an interrupt operation or a reset operation via the second control interface and the first control interface.

The wall switch panel provided by the example of the present disclosure includes a touch panel, a micro-control module and a wireless module. The touch panel is configured to transmit obtained touch information of a user to the micro-control module via the first communication interface and the second communication interface; the micro-control module is configured to generate a parameter adjustment instruction according to the touch information, and to transmit the parameter adjustment instruction to the wireless module via the third communication interface and the fourth communication interface; and the wireless module is configured to send, via an antenna, the parameter adjustment instruction to an electrical appliance to be controlled, so as to drive the electrical appliance to be controlled to perform a corresponding adjustment operation, thus realizing the control of the electrical appliance to be controlled according to the touch information, and achieving multifunctional control.

The light fitting provided by the example of the present disclosure can include the wall switch panel as mentioned above, a wireless receiving module, a controller and a light body; the wireless receiving module is electrically connected with the controller, and the wireless receiving module is configured to receive the parameter adjustment instruction sent by the wireless module of the wall switch panel and to send the parameter adjustment instruction to the controller; the controller is electrically connected with the light body, and the controller adjusts the light body according to the parameter adjustment instruction, correspondingly.

As shown in FIG. 1, the wall switch panel can include a touch panel 101, a micro-control module 104 and a wireless module 103. The connection and operation relationship among the touch panel 101, the micro-control module 104 and the wireless module 103 are described below, the details are as follows:

The touch panel 101 is configured to obtain touch information of a user, and the touch panel 101 has a first communication interface. The touch information can include touch position information and/or the count of touch points.

Illustratively, the touch information is the number of touch points, which can be 11. That is, the touch panel 101 described in the example of the present disclosure supports 11-point simultaneous touch.

In some implementations, the operation current of the touch panel in the low power consumption operating mode ranges from 8 mA to 12 mA; the operation current of the touch panel in the standby mode is 3 mA, and the operation current of the touch panel in the sleep mode is less than 20 µA.

In some implementations, the accuracy of the touch panel 101 is ±1 mm at the center and ±1.5 mm at the peripheral edges.

It should be added here that the touch panel 101 provided by the example of the present disclosure can operate normally under the condition of water mist.

The micro-control module 104 has a second communication interface and a third communication interface, and is electrically connected with the first communication interface through the second communication interface. The micro-control module 104 is configured to receive the touch information via the first communication interface and the second communication interface, and to generate a parameter adjustment instruction according to the touch information.

Illustratively, the touch information is touch position information, and the micro-control module stores the corresponding relationship between the touch position information and parameter adjustment instruction. The micro-control module generates a parameter adjustment instruction based on the touch position information and the corresponding relationship between the touch position information and the parameter adjustment instruction.

For example, the touch position information is coordinate point $A(X_1, Y_1)$, the coordinate point A corresponds to the 50% brightness adjustment instruction of the light fitting, and the micro-control module generates the 50% brightness adjustment instruction of the light fitting based on the coordinate point A and the corresponding relationship between the coordinate point A and the 50% brightness adjustment instruction of the light fitting.

For example, the touch position information is coordinate point $B(X_2, Y_2)$, the coordinate point B corresponds to the chromaticity adjustment instruction of cool color of the light fitting, and the micro-control module generates the chromaticity adjustment instruction of cool color of the light fitting based on the coordinate point B and the corresponding relationship between the coordinate point B and the chromaticity adjustment instruction of cool color of the light fitting.

Illustratively, the touch information is the number of touch points, and the micro-control module stores the corresponding relationship between the number of touch points and the parameter adjustment instruction. The micro-control module generates a parameter adjustment instruction based on the number of touch points and the corresponding relationship between the number of touch points and the parameter adjustment instruction.

For example, the number of touch points is 11, and 11 touch points correspond to the chromaticity adjustment instruction of warm color of the light fitting. The micro-control module generates the chromaticity adjustment instruction of warm color of the light fitting based on the 11 touch points and the corresponding relationship between the 11 touch points and the chromaticity adjustment instruction of warm color of the light fitting.

For example, the number of touch points is 3, 3 touch points correspond to the 70% brightness adjustment instruction of the light fitting, and the micro-control module generates the 70% brightness adjustment instruction of the light fitting based on the 3 touch points and the corresponding relationship between the 3 touch points and the 70% brightness adjustment instruction of the light fitting.

The wireless module 103 has a fourth communication interface and is electrically connected with the third communication interface through the fourth communication interface. The wireless module 103 is configured to send, via the antenna, the parameter adjustment instruction to an electrical appliance to be controlled, so as to drive the electrical appliance to perform a corresponding adjustment operation.

Illustratively, the electric appliance to be controlled can be a light fitting, and the light fitting has a wireless receiving module used for receiving the parameter adjustment instruction.

The wireless module 103 can include a WIFI module and/or an RF (Radio Frequency) module.

In some implementations, as shown in FIG. 1, 001 is SDA, 002 is SCL, 003 is +3.3V, 004 is GND, 005 is INT, 006 is RST, 007/008/009/010 are SPI communication bus interfaces, 011 is +5V, 012 is GND, 013/014/015 are control interfaces of three-way control delay.

The touch panel TP101 obtains touch position information of a user's touch operation; and the micro-control module MCU104 judges the parameter adjustment instruction according to the position information. When the user touches TP, the first communication interface of the touch panel TP101 is mainly an I2C interface, which communicates via the I2C bus, and the micro-control module 104 reads the I2C bus signal via the second communication interface to obtain the position information. The micro-control module 104 converts the obtained position information into a parameter adjustment instruction, and then transmits the parameter adjustment instruction to the wireless module 103 via the third communication interface; and the wireless module 103 transmits the parameter adjustment instruction to the light fitting via the antenna, so as to drive the light fitting to perform a corresponding adjustment operation, thus realizing the adjustment of the light intensity, color temperature and other modes of the light fitting.

In practical application, the wall switch panel provided by the example of the present disclosure can include a circle of surrounding walls, a middle frame and an adhesive layer; the surrounding walls are arranged in the middle frame, and besides, the middle frame can further include a bottom plate; the surrounding walls are arranged around the bottom plate; and the touch panel is adhered to the bottom plate through the adhesive layer. Of course, the wall switch panel can further include other structures, without being specifically limited in the example of the present disclosure.

The light fitting provided by the example of the present disclosure includes a wall switch panel, and the wall switch panel includes a touch panel, a micro-control module and a wireless module. The touch panel is configured to transmit obtained touch information of a user to the micro-control module via the first communication interface and the second communication interface; the micro-control module is configured to generate a parameter adjustment instruction according to the touch information, and to transmit the parameter adjustment instruction to the wireless module via the third communication interface and the fourth communication interface; and the wireless module is configured to send, via an antenna, the parameter adjustment instruction to an electrical appliance to be controlled, so as to drive the electrical appliance to be controlled to perform a corresponding adjustment operation, thus realizing the control of the electrical appliance to be controlled according to the touch information, and achieving multifunctional control.

The present disclosure discloses a wall switch panel and a light fitting, which are used for solving the problem of single function of the existing wall switch.

Examples of the present disclosure adopts the following technical solutions:

In the first aspect, the present disclosure provides a wall switch panel, including:
  a touch panel, having a first communication interface;
  a micro-control module, having a second communication interface and a third communication interface, and the micro-control module being electrically connected with the first communication interface through the second communication interface;
  a wireless module, having a fourth communication interface and being electrically connected with the third communication interface through the fourth communication interface;
  wherein the touch panel is configured to transmit obtained touch information of a user to the micro-control module via the first communication interface and the second communication interface;
  the micro-control module is configured to generate a parameter adjustment instruction according to the touch information, and to transmit the parameter adjustment instruction to the wireless module via the third communication interface and the fourth communication interface;
  the wireless module is configured to send, via an antenna, the parameter adjustment instruction to an electrical appliance to be controlled, so as to drive the electrical appliance to be controlled to perform a corresponding adjustment operation.

Further, the wall switch panel further includes a power module;
  the micro-control module further has a third control interface;
  the power module includes a relay and is electrically connected with the third control interface through the relay;
  wherein the micro-control module is further configured to generate a switch control instruction according to the touch information, and transmit the switch control instruction to the relay via the third control interface, so as to drive the relay to perform a corresponding switch operation.

Further, the touch panel further has a first power interface;
  the micro-control module further has a second power interface and a third power interface, and the micro-control module is electrically connected with the first power interface through the second power interface;

the power module includes a fourth power interface and is electrically connected with the third power interface through the fourth power interface;

wherein the power module is configured to supply power to the micro-control module through the fourth power interface and the third power interface, and to supply power to the touch panel through the fourth power interface, the third power interface, the second power interface and the first power interface.

Further, the touch panel further has a first control interface;

the micro-control module further has a second control interface and is electrically connected with the first control interface through the second control interface;

wherein the micro-control module is configured to control the touch panel to perform an interrupt operation or a reset operation via the second control interface and the first control interface.

Further, the touch information includes touch position information and/or a count of touch points.

Further, the wireless module includes a WIFI module and/or an RF module.

Further, the electrical appliance to be controlled includes a light fitting.

Further, an operation current of the touch panel in a low power consumption operating mode ranges from 8 mA to 12 mA; an operation current of the touch panel in a standby mode is 3 mA, and an operation current of the touch panel in a sleep mode is less than 20 μA.

Further, an accuracy of the touch panel is ±1 mm at a center and ±1.5 mm at peripheral edges.

Further, a maximum switching voltage of the relay is 277 VAC/30 VDC, a maximum switching current of the relay is 10 A, and a maximum switching power of the relay is 2500 WAC/300 WDC.

In the second aspect, the present disclosure provides a light fitting, including: the wall switch panel as mentioned above, a wireless receiving module, a controller and a light body;

the wireless receiving module is electrically connected with the controller, and the wireless receiving module is configured to receive the parameter adjustment instruction sent by the wireless module of the wall switch panel and to send the parameter adjustment instruction to the controller;

the controller is electrically connected with the light body, and the controller adjusts the light body according to the parameter adjustment instruction, correspondingly.

The above-mentioned at least one technical solution adopted by the example of the disclosure can achieve the following beneficial effects:

Examples of the present disclosure provides a wall switch panel, including a touch panel, a micro-control module, and a wireless module. The touch panel is configured to transmit obtained touch information of a user to the micro-control module via the first communication interface and the second communication interface; the micro-control module is configured to generate a parameter adjustment instruction according to the touch information, and to transmit the parameter adjustment instruction to the wireless module via the third communication interface and the fourth communication interface; the wireless module is configured to send, via an antenna, the parameter adjustment instruction to an electrical appliance to be controlled, so as to drive the electrical appliance to be controlled to perform a corresponding adjustment operation, thus realizing the control of the electrical appliance to be controlled according to the touch information, and achieving multifunctional control.

The present disclosure may include dedicated hardware implementations such as application specific integrated circuits, programmable logic arrays and other hardware devices. The hardware implementations can be constructed to implement one or more of the methods described herein. Examples that may include the apparatus and systems of various implementations can broadly include a variety of electronic and computing systems. One or more examples described herein may implement functions using two or more specific interconnected hardware modules or devices with related control and data signals that can be communicated between and through the modules, or as portions of an application-specific integrated circuit. Accordingly, the system disclosed may encompass software, firmware, and hardware implementations. The terms "module," "sub-module," "circuit," "sub-circuit," "circuitry," "sub-circuitry," "unit," or "sub-unit" may include memory (shared, dedicated, or group) that stores code or instructions that can be executed by one or more processors. The module refers herein may include one or more circuit with or without stored code or instructions. The module or circuit may include one or more components that are connected.

Those skilled in the art should understand that although the examples of the present disclosure have been described, those skilled in the art can make additional changes and modifications to these examples once they have learned the basic creative concepts.

Those skilled in the art can make various modifications and variations to the present disclosure without departing from the scope of the present disclosure.

What is claimed is:

1. A wall switch panel, comprising:
a touch panel, having a first communication interface;
a micro-control module, having a second communication interface and a third communication interface, and the micro-control module being electrically connected with the first communication interface through the second communication interface; and
a wireless module, having a fourth communication interface and being electrically connected with the third communication interface through the fourth communication interface,
wherein the touch panel is configured to transmit obtained touch information of a user to the micro-control module via the first communication interface and the second communication interface;
the micro-control module is configured to generate a parameter adjustment instruction according to the touch information, and to transmit the parameter adjustment instruction to the wireless module via the third communication interface and the fourth communication interface; and
the wireless module is configured to send, via an antenna, the parameter adjustment instruction to an electrical appliance to be controlled, so as to drive the electrical appliance to be controlled to perform a corresponding adjustment operation,
wherein the wall switch panel further comprises a power module;
the micro-control module further comprises a third control interface; and
the power module comprises a relay and is electrically connected with the third control interface through the relay,
wherein the micro-control module is further configured to generate a switch control instruction according to the touch information, and transmit the switch control instruction to the relay via the third control interface, so as to drive the relay to perform a corresponding switch operation.

2. The wall switch panel according to claim 1, wherein:
the touch panel further comprises a first power interface;
the micro-control module further comprises a second power interface and a third power interface, and the micro-control module is electrically connected with the first power interface through the second power interface; and
the power module comprises a fourth power interface and is electrically connected with the third power interface through the fourth power interface,
wherein the power module is configured to supply power to the micro-control module through the fourth power interface and the third power interface, and to supply power to the touch panel through the fourth power interface, the third power interface, the second power interface and the first power interface.

3. The wall switch panel according to claim 1, wherein:
the touch panel further comprises a first control interface; and
the micro-control module further comprises a second control interface and is electrically connected with the first control interface through the second control interface; and
wherein the micro-control module is configured to control the touch panel to perform an interrupt operation or a reset operation via the second control interface and the first control interface.

4. The wall switch panel according to claim 1, wherein the touch information comprises touch position information and/or a count of touch points.

5. The wall switch panel according to claim 1, wherein the wireless module comprises a WIFI module and/or an RF module.

6. The wall switch panel according to claim 1, wherein the electrical appliance to be controlled comprises a light fitting.

7. The wall switch panel according to claim 1, wherein an operation current of the touch panel in a low power consumption operating mode ranges from 8 mA to 12 mA; an operation current of the touch panel in a standby mode is 3 mA; and an operation current of the touch panel in a sleep mode is less than 20 µA.

8. The wall switch panel according to claim 1, wherein an accuracy of the touch panel is ±1 mm at a center and ±1.5 mm at peripheral edges.

9. The wall switch panel according to claim 1, wherein a maximum switching voltage of the relay is 277 VAC/30 VDC, a maximum switching current of the relay is 10 A, and a maximum switching power of the relay is 2500 WAC/300 WDC.

10. A light fitting, comprising: a wall switch panel, a wireless receiving module, a controller and a light body;
wherein the wall switch panel comprises
a touch panel, having a first communication interface;
a micro-control module, having a second communication interface and a third communication interface, and the micro-control module being electrically connected with the first communication interface through the second communication interface;
a wireless module, having a fourth communication interface and being electrically connected with the third communication interface through the fourth communication interface;
wherein the touch panel is configured to transmit obtained touch information of a user to the micro-control module via the first communication interface and the second communication interface;
the micro-control module is configured to generate a parameter adjustment instruction according to the touch information, and to transmit the parameter adjustment instruction to the wireless module via the third communication interface and the fourth communication interface;
the wireless module is configured to send, via an antenna, the parameter adjustment instruction to an electrical appliance to be controlled, so as to drive the electrical appliance to be controlled to perform a corresponding adjustment operation; and
wherein the wireless receiving module is electrically connected with the controller, and the wireless receiving module is configured to receive the parameter adjustment instruction sent by the wireless module of the wall switch panel and to send the parameter adjustment instruction to the controller; and
the controller is electrically connected with the light body, and the controller adjusts the light body according to the parameter adjustment instruction, correspondingly.

11. The light fitting according to claim 10, wherein:
wherein the wall switch panel further comprises a power module;
the micro-control module further comprises a third control interface; and
the power module comprises a relay and is electrically connected with the third control interface through the relay,
wherein the micro-control module is further configured to generate a switch control instruction according to the touch information, and transmit the switch control instruction to the relay via the third control interface, so as to drive the relay to perform a corresponding switch operation.

12. The light fitting according to claim 11, wherein:
the touch panel further comprises a first power interface;
the micro-control module further comprises a second power interface and a third power interface, and the micro-control module is electrically connected with the first power interface through the second power interface; and
the power module comprises a fourth power interface and is electrically connected with the third power interface through the fourth power interface,
wherein the power module is configured to supply power to the micro-control module through the fourth power interface and the third power interface, and to supply power to the touch panel through the fourth power interface, the third power interface, the second power interface and the first power interface.

13. The light fitting according to claim 10, wherein:
the touch panel further comprises a first control interface; and
the micro-control module further comprises a second control interface and is electrically connected with the first control interface through the second control interface; and
wherein the micro-control module is configured to control the touch panel to perform an interrupt operation or a reset operation via the second control interface and the first control interface.

14. The light fitting according to claim 10, wherein the touch information comprises touch position information and/or a count of touch points.

15. The light fitting according to claim 10, wherein the wireless module comprises a WIFI module and/or an RF module.

16. The light fitting according to claim 10, wherein the electrical appliance to be controlled comprises a light fitting.

17. The light fitting according to claim 10, wherein an operation current of the touch panel in a low power consumption operating mode ranges from 8 mA to 12 mA; an operation current of the touch panel in a standby mode is 3 mA; and an operation current of the touch panel in a sleep mode is less than 20 μA.

18. The light fitting according to claim 10, wherein an accuracy of the touch panel is ±1 mm at a center and ±1.5 mm at peripheral edges.

19. The light fitting according to claim 11, wherein a maximum switching voltage of the relay is 277 VAC/30 VDC, a maximum switching current of the relay is 10 A, and a maximum switching power of the relay is 2500 WAC/300 WDC.

* * * * *